(12) United States Patent
Wolf et al.

(10) Patent No.: US 6,596,446 B2
(45) Date of Patent: Jul. 22, 2003

(54) ORGANIC PIGMENTS IN COLOR FILTERS LIQUID OF CRYSTAL DISPLAY

(75) Inventors: Mickey Wolf, Mayesville, SC (US); Rolf Richter, Leverkusen (DE); Kent Faubion, Charleston, SC (US); Udo Herrmann, Dormagen (DE); Josef Witt, Leverkusen (DE); Peter-Roger Nyssen, Dormagen (DE)

(73) Assignee: Bayer Aktiengesellschaft, Leverkusen (DE)

( * ) Notice: Subject to any disclaimer, the term of this patent is extended or adjusted under 35 U.S.C. 154(b) by 168 days.

(21) Appl. No.: 09/825,322

(22) Filed: Apr. 3, 2001

(65) Prior Publication Data

US 2002/0034696 A1 Mar. 21, 2002

(30) Foreign Application Priority Data

Apr. 4, 2000 (DE) .......................... 100 16 665
May 22, 2000 (DE) .......................... 100 25 303

(51) Int. Cl.$^7$ .......................... G02B 5/20; G02F 1/1335
(52) U.S. Cl. .......................... 430/7; 359/891; 349/106
(58) Field of Search .......................... 430/7; 359/891; 349/106

(56) References Cited

U.S. PATENT DOCUMENTS

| | | | |
|---|---|---|---|
| 4,622,391 A | 11/1986 | Lorenz et al. | |
| 4,628,082 A | 12/1986 | Lorenz et al. | |
| 6,077,339 A | 6/2000 | Nyssen et al. | |
| 6,211,346 B1 | 4/2001 | Linke et al. | |
| 6,245,138 B1 | 6/2001 | Nyssen et al. | |
| 6,261,358 B1 | 7/2001 | Sommer et al. | |
| 6,281,338 B1 | 8/2001 | Sommer et al. | |

FOREIGN PATENT DOCUMENTS

| | | |
|---|---|---|
| DE | 195 35 246 | 3/1997 |
| DE | 198 01 759 | 7/1999 |
| EP | 073464 | 5/1985 |
| EP | 947563 | 10/1999 |
| JP | 63-286802 A * | 11/1988 |
| JP | 1-109302 A * | 4/1989 |
| JP | 5-281414 A * | 10/1993 |
| JP | 11-209631 | 8/1999 |
| JP | 11-209632 | 8/1999 |
| JP | 11-217514 | 8/1999 |

OTHER PUBLICATIONS

Bayer Farben Revue, Sonderheft 3/2 D, (month unavailable) 1986, pp. 12–14.
Rommp Lexikon, Lacke und Druckfarben, Dr. Ulrich Zorll, Thieme Verlag Stuttgart–New York, (month unavailable) 1998, pp. 445–446 and 491–492.

* cited by examiner

Primary Examiner—John A. McPherson
(74) Attorney, Agent, or Firm—Godfried R. Akorli; Diderico van Eyl

(57) ABSTRACT

The invention relates to pigment preparations comprising a metal complex of a mono-, di-, tri-, or tetraanion of an azo compound that in its free acid form conforms to formula (I) or a tautomeric form thereof

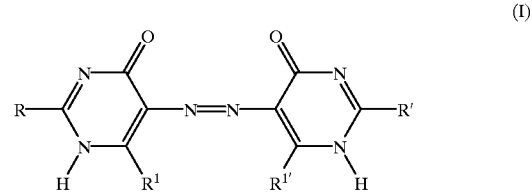

(I)

wherein
  R and R' are independently OH, $NH_2$, NH—CN, acylamino, or arylamino, and
  $R^1$ and $R^{1'}$ are independently —OH or —$NH_2$,
with a metal selected from the group consisting of Na, K, Ca, Sr, Ba, Zn, Fe, Ni, Cu, Mn, La, Li, Cs, Mg, Cd, Co, Al, Cr, Sn, and Pb,
wherein the metal complex hosts at least one guest compound.

17 Claims, No Drawings

ORGANIC PIGMENTS IN COLOR FILTERS LIQUID OF CRYSTAL DISPLAY

The invention relates to the use of metal complex pigments in color filters and also to pigment preparations and to their use for producing color filters and also the color filters themselves.

Color filters today are chiefly used in liquid-crystal displays, screens, color resolution instruments and sensors. The flat screens of personal computers are a well-known example. There are various ways to produce color filters, which differ not only in the way the colors are applied but also in the generation of the color element patterns from the primary colors red, green and blue as well as black. The colors may be applied for example by coloring a base layer (e.g. gelatin) by means of soluble dyes or pigments ("Dye Method", "Dye Dispersion Method"), screen printing, offset printing or inkjet printing of pigment pastes, preparations or inks, electrodeposition of photoresists based on dyes or pigments and also in particular by the pigment dispersion method, which involves the use of pigments dispersed either in a polyimide resin ("non-photosensitive polyimide method") or in a photoresist ("photosensitive acrylic method"). Associated with the methods mentioned, both the direct generation of the color element patterns by printing and the indirect, photolithographic generation are important, the latter in relation to the abovementioned pigment dispersion method in particular. The technique of the a pigment dispersion method in the form of the "non-photosensitive polyimide method" is disclosed for example in JP-A-10-22392 (1998).

In the pigment dispersion method involving the use of a photoresist, the coloring pigments are present dispersed in a UV-curable photoresist. The photoresist, as well as the pigment, generally consists of binder resin, polymerizable monomer photoinitiator and optionally a solvent. It is prepared for example by first finely dispersing the pigment in the form of a concentrate in a solvent and optionally binder resin and adjusted immediately prior to application together with the monomer and the photoinitiator and optionally further components. The pigmented photoresist is uniformly applied to the substrate, for example glass, for example, by spin coating, predried, UV-irradiated by means of a photomask, developed by means of generally inorganic alkaline solution to form the desired color element patterns, and the coating is cleaned and optionally aftercured. This process is repeated for every color, i.e. generally 3 times for a trichromat in the colors red, green and blue, for example.

The advantages of using pigments in conjunction with the pigment dispersion method are the improved light, moisture and heat resistance of the color filters compared to dye-based coating systems. On the other hand, the transparency and color purity of coatings based on pigments are still unsatisfactory, regardless of the coating method. In particular, the incorporation in the photoresist of various pigments mixed to match the desired color locus values is accompanied by undesirable brilliancy and transparency losses, so that the LCDs have increased energy requirements as a consequence.

Individual pigments used in prior art color filters are disclosed for example in JP-A-10-22392 (Toray 1998), JP-A-10-19183 (Hitachi 1998: specific Pigment Colour Index Pigment Yellow 150) and JP-A-10-19184 (Hitachi 1998). However, these are still in need of improvement with regard to the requirements described. It is an object of the present invention to provide novel pigments for use in color filters having improved color purity and transparency and superior lightfastness. The pigments should further be the readily dispersible in polar and apolar organic media, so that they are stabilizable in finely divided form in the various matrix systems or vehicle media of the aforementioned production methods for color filters.

It was found that, surprisingly, specific metal complex pigments as described in similar fashion in EP-A-73463 very substantially meet the required fastness and coloristic requirements, especially transparency and color purity in mixtures with each other and with other pigments.

The invention accordingly provides for the use of metal complexes of an azo compound which conforms to the formula (I) or to one of its tautomeric structures

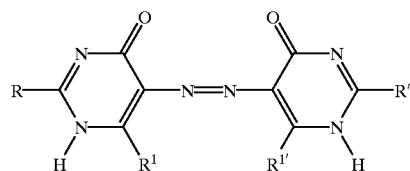

where
R and R' are independently OH, $NH_2$, NH—CN, acylamino or arylamino and
$R^1$ and $R^{1'}$ are independently —OH or —$NH_2$,
and which host at least one guest compound, the metal complexes corresponding to the mono-, di-, tri- and tetraanions of the azo compounds of the formula (I) with the metals Li, Cs, Mg, Cd, Co, Al, Cr, Sn, Pb, particularly preferably Na, K, Ca, Sr, Ba, Zn, Fe, Ni, Cu, Mn and La, as pigments in color filters for liquid-crystal displays.

Aryl substituents in the formula (I) are preferably phenyl or naphthyl, which may each be substituted, for example by halogens such as F, Cl, Br, —OH, $C_1$–$C_6$-alkyl, $C_1$–$C_6$-alkoxy, —$NH_2$, —$NO_2$ and —CN.

Acyl substituents in the formula (I) are preferably selected from the group consisting of ($C_1$–$C_6$-alkyl)carbonyl, phenylcarbonyl, $C_1$–$C_6$-alkylsulphonyl, phenylsulphonyl, optionally $C_1$–$C_6$-alkyl-, phenyl- or naphthyl-substituted carbamoyl, optionally $C_1$–$C_6$-alkyl-, phenyl- or naphthyl-substituted sulphamoyl or optionally $C_1$–$C_6$-alkyl, phenyl- or naphthyl-substituted guanyl, where the alkyl radicals mentioned may additionally be substituted, for example by halogen, especially Cl, Br or F, —OH, —CN, —$NH_2$ and/or $C_1$–$C_6$-alkoxy and the phenyl and naphthyl radicals mentioned may be substituted for example by halogen especially F, Cl or Br, —OH, $C_1$–$C_6$-alkyl, $C_1$–$C_6$-alkoxy, —$NH_2$, —$NO_2$ and/or —CN.

The invention provides in particular for the use of the metal complex pigments prepared on the basis of the mono- and/or dipotassium salts of an azo compound of the formula (1) or one of its tautomeric forms and also the hydrates as pigments in color filters for liquid-crystal displays.

These salts underlying the metal complexes to be used according to the invention preferably contain no or only negligible amounts of diazobarbituric acid, the metal complexes themselves are therefore particularly low in by-products and are therefore very particularly suitable for use in color filters with regard to color purity and transparency.

Metal complexes for the purposes of this application also include metal salts.

Very particularly preferred metal complexes are those of azo compounds of the formula (I), preferably of the potassium salts of these azo compounds, which in the form of their free acid or one of its tautomeric structures conform to the formula (II)

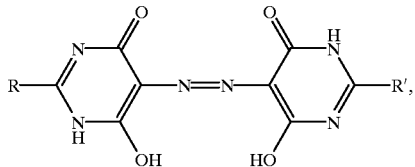
(II)

where

R and R' are independently selected from the group consisting of OH and NHCN, and which host at least one other compound as guest.

Preference is given in particular to organic metal complexes of azo compounds of the formula (II), preferably of the potassium salts of these azo compounds, which in the form of their free acid or one of the tautomeric structures conform to the formulae (IIa to IIc)

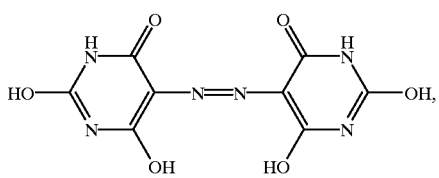
(IIa)

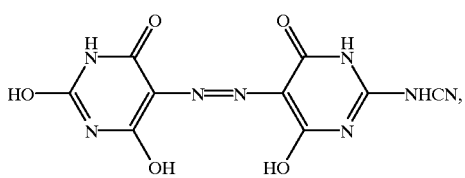
(IIb)

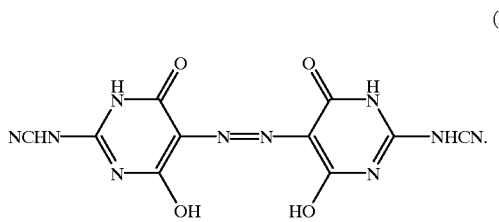
(IIc)

Metal complexes of the mono- or dipotassium salts of the azobarbituric acid of formula (1), especially (IIa), are particularly preferred.

The compounds of the formula (1) are particularly preferably 1:1 azo metal complexes which conform to the formula (Ia) or one of its tautomeric forms

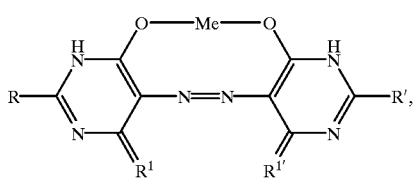
(Ia)

where

Me corresponds to one of the metal centers mentioned above,

R and R' are each as defined above and $R^1$ and $R^{1'}$ are independently =O or =NH.

Particular preference is given to salts and complexes of the formulae (I, Ia, IIa, IIb, IIc) with bi- or tervalent metals, especially the nickel salts and complexes.

Very particular preference is given to the use of metal complexes where the azobarbituric acid-nickel 1:1 complex corresponds to one of the tautomeric forms of the formula (IIa) and hosts at least one other compound as guest.

Generally the metal complex compound obtainable from the process according to the invention forms a layered crystal lattice in which the bonding within any one layer is substantially via hydrogen bonds and/or metal ions. Preferably the metal complex compounds are metal compounds which form a crystal lattice which consists of substantially planar layers.

The metal complexes hosting other compounds as guests can be present as inclusion compounds, intercalation compounds and also as solid solutions.

Useful metal complexes also include metal complexes in which a metal-containing compound, for example a salt or metal complex, is incorporated into the crystal lattice of the metal complex. In this case, in the formula (I), a portion of the metal of the metal salts of the azo compound may be replaced by other metal ions, or further metal ions can enter into a more or less pronounced interaction with the metal complex.

Useful guest compounds include not only organic but also inorganic compounds.

Useful guest compounds come from a very wide variety of classes of compounds. For purely practical reasons, preference is given to such compounds as are liquid or solid under normal conditions (25° C., 1 bar).

Of the liquid substances, preference is given in turn to those which have a boiling point of 100° C. or higher, preferably of 150° C. and higher. Suitable compounds are preferably acyclic and cyclic organic compounds, for example aliphatic and aromatic hydrocarbons, which may be substituted, for example by OH, COOH, $NH_2$, substituted $NH_2$, $CONH_2$, substituted $CONH_2$, $SO_2NH_2$, substituted $SO_2NH_2$, $SO_3H$, halogen, $NO_2$, CN, —$SO_2$-alkyl, —$SO_2$-aryl, —O-alkyl, —O-aryl, —O-acyl.

Aryl substituents are preferably phenyl or naphthyl, which may each be substituted for example by halogen such as F, Cl, Br, —OH, $C_1$–$C_6$-alkyl, $C_1$–$C_6$-alkoxy, —$NH_2$, —$NO_2$ and/or —ON.

Alkyl substituents are preferably $C_1$–$C_6$-alkyl, which may be substituted for example by halogen such as chlorine, bromine, fluorine, —OH, —CN, —$NH_2$ and/or $C_1$–$C_6$-alkoxy.

Cycloalkyl substituents are preferably $C_3$–$C_7$-cycloalkyl, especially $C_5$–$C_6$-cycloalkyl, which may be substituted for example by $C_1$–$C_6$-alkyl, $C_1$–$C_6$-alkoxy, halogen such as Cl, Br, F, $C_1$–$C_6$-alkoxy, —OH, —CN and $NH_2$.

Aralkyl substituents are preferably phenyl- or naphthyl-$C_1$–$C_4$-alkyl, which may be substituted in the aromatic radicals by halogen such as F, Cl, Br, —OH, $C_1$–$C_6$-alkyl, $C_1$–$C_6$-alkoxy, —$NH_2$, —$NO_2$ and/or —CN, for example.

Acyl substituents are preferably ($C_1$–$C_6$-alkyl)-carbonyl, phenylcarbonyl, $C_1$–$C_6$-alkylsulphonyl, phenylsulphonyl, optionally $C_1$–$C_6$-alkyl-, phenyl- and naphthyl-substituted carbamoyl, optionally $C_1$–$C_6$-alkyl-, phenyl- and naphthyl-substituted sulphamoyl or optionally $C_1$–$C_6$-alkyl-, phenyl- or naphthyl-substituted guanyl, where the alkyl radicals mentioned may be substituted for example by halogen such as Cl, Br, F, —OH, —CN, —NH$_2$ or C$_1$–C$_6$-alkoxy and the phenyl and naphthyl radicals mentioned may be substituted for example by halogen such as F, Cl, Br, —OH, C$_1$–C$_6$-alkyl, C$_1$–C$_6$-alkoxy, —NH$_2$, —NO$_2$ and/or —CN.

Specific examples of preferred intercalates are paraffins and paraffin oils; triisobutylene, tetraisobutylene, mixtures of aliphatic and aromatic hydrocarbons as produced in petroleum fractionation for example; chlorinated paraffin hydrocarbons such as dodecyl chloride or steal chloride; C$_{10}$–C$_{30}$-alcohols such as 1-decanol, 1-dodecanol, 1-hexadecanol, 1-octadecanol and their mixtures, olein alcohol, 1,12-octadecanediol, fatty acids and their salts and mixtures, for example formic acid, acetic acid, dodecanoic acid, hexadecanoic acid, octadecanoic acid, oleic acid, fatty acid esters, for example the methyl esters of C$_{10}$–C$_{20}$-fatty acids, fatty acid amides, such as stearamide, stearic acid monoethanolamide, stearic acid diethanolamide, stearonitrile, fatty amines, for example dodecylamine, cetylamine, hexadecylamine, octadecylamine and others; salts of fatty amines with sulphonic and carboxylic acids, isocyclic hydrocarbons such as cyclododecane, decahydronaphthalene, o-, m-, p-xylene, mesitylene, dodecylbenzene mixture, tetralin, naphthalene, 1-methylnaphthalene, 2-methylnaphthalene, biphenyl, diphenylmethane, acenaphthene, fluorene, anthracene, phenanthrene, m-, p-terphenyl, o-, p-dichlorobenzene, nitrobenzene, 1-chloronaphthalene, 2-chloronaphthalene, 1-nitronaphthalene, isocyclic alcohols and phenols and their derivatives such as benzyl alcohol, decahydro-2-naphthol, diphenyl ether, sulphones, for example diphenyl sulphone, methyl phenyl sulphone, 4,4'-bis-2-(hydroxyethoxy) diphenyl sulphone; isocyclic carboxylic acids and their derivatives such as benzoic acid, 3-nitrobenzoic acid, cinnamic acid, 1-naphthalenecarboxylic acid, phthalic acid, dibutyl phthalate, dioctyl phthalate, tetrachlorophthalic acid, 2-nitrobenzamide, 3-nitrobenzamide, 4-nitrobenzamide, 4-chlorobenzamide, sulphonic acids, such as 2,5-dichlorobenzenesulphonic acid, 3-nitro-, 4-nitrobenzenesulphonic acid, 2,4-dimethylbenzenesulphonic acid, 1- and 2-naphthalenesulphonic acid, 5-nitro-1- and 5-nitro-2-naphthalenesulphonic acid, di-sec-butylnaphthalenesulphonic acid mixture, biphenyl-4-sulphonic acid, 1,4-, 1,5-, 2,6-, 2,7-naphthalenedisulphonic acid, 3-nitro-1,5-naphthalenedisulphonic acid, 1-anthraquinonesulphonic acid, 2-anthraquinonesulphonic acid, biphenyl-4,4'-disulphonic acid, 1,3,6-naphthalenetrisulphonic acid and the salts of these sulphonic acids e.g. the sodium, potassium, calcium, zinc, nickel and copper salts; sulphonamides such as benzenesulphonamide, 2-, 3- and 4-nitro-benzenesulphonamide, 2-, 3- and 4-chlorobenzenesulphonamide, 4-methoxybenzenesulphonamide, 3,3'-sulphonyl-bisbenzenesulphonamide, 4,4'-oxybisbenzene-sulphonamide, 1- and 2-naphthalenesulphonamide.

Carboxamides and sulphonamides are a preferred group of compounds to be included; also suitable in particular are urea and substituted ureas such as phenylurea, dodecylurea and others and also their polycondensates with aldehydes, especially formaldehyde; heterocycles such as barbituric acid, benzimidazolone, 5-benzimidazolonesulphonic acid, 2,3-dihydroxyquinoxaline, 2,3-dihydroxy-quinoxaline-6-sulphonic acid, carbazole, carbazole-3,6-disulphonic acid, 2-hydroxyquinoline, 2,4-dihydroxyquinoline, caprolactam, melamine, 6-phenyl-1,3,5-triazine-2,4-diamine, 6-methyl-1,3,5-triazine-2,4diamine, cyanuric acid. Preferred metal complexes include surface-active compounds, especially surfactants, which are known for example from K. Lindner, Tenside-Textilhilfsmittel-Waschrohstoffe, 2$^{nd}$ edition, Volume I, Wissenschaftliche Verlagsgesellschaft mbH, Stuttgart, 1964. They can be anionic, non-ionic or cationic compounds or ampholytes. Examples of suitable anionic compounds are true soaps, salts of aminocarboxylic acids, salts of lower or higher acylated aminocarboxylic acids, fatty acid sulphates, sulphates of fatty acid esters, amides etc., primary alkyl sulphates, sulphates of oxo alcohols, secondary alkyl sulphates, sulphates of esterified or etherified polyoxy compounds, sulphates of substituted polyglycol ethers (sulphated ethylene oxide adducts), sulphates of acylated or alkylated alkanolamines, sulphonates of fatty acids, their esters, amides, etc., primary alkyl sulphonates, secondary alkyl sulphonates, alkyl sulphonates with acyls attached in ester fashion, alkyl or alkylphenyl ether sulphonates, sulphonates of polycarboxylic esters, alkylbenzenesulphonates, alkylnaphthalenesulphonates, fatty aromatic sulphonates, alkylbenzimidazolesulphonates, phosphates, polyphosphates, phosphonates, phosphinates, thiosulphates, hydrosulphites, sulphinates, persulphates. Examples of suitable non-ionic compounds are esters and ethers of polyalcohols, alkyl polyglycol ethers, acyl polyglycol ethers, alkylaryl polyglycol ethers, acylated and alkylated alkanolamine polyglycol ethers. Examples of suitable cationic compounds are alkylamine salts, quaternary ammonium salts, alkylpyridinium salts, simple and quaternary imidazoline salts, alkyldiamines and alkylpolyamines, alkyldiamines and acylpolyamines, acylalkanolamines, alkanolamine esters, alkyl-OCH$_2$—N-pyridinium salts, alkyl-CO—NH—CH$_2$—N-pyridinium salts, alkylethyleneureas, sulphonium compounds, phosphonium compounds, arsenium compounds, alkylguanidines, acyl-biguanidides. Examples of suitable ampholytes are alkylbetaines, sulphobetaines and aminocarboxylic acids. Preference is given to using non-ionic surfactants, especially the ethylene oxide addition products of fatty alcohols, fatty amines and also of octyl- or nonylphenol.

A further important group of guest compounds are natural resins and resin acids such as for example abietic acid and its conversion products and salts. Examples of such conversion products are hydrogenated, dehydrogenated and disproportionated abietic acids. These can further be dimerized, polymerized or modified by addition of maleic anhydride and fumaric acid. Also of interest are the resin acids modified at the carboxyl group such as for example the methyl, hydroxyethyl, glycol, glyceryl and pentaerythritol esters and also resin acid nitriles and resin acid amines and also dehydroabietyl alcohol.

Also suitable for intercalation are polymers, for example ethylene-propylene oxide block polymers, preferably having a number average molecular weight Mn not less than 1000, especially of 1000 to 10000 g/mol, polyvinyl alcohol, poly (meth)acrylic acids, modified cellulose, such as carboxymethylcelluloses, hydroxyethyl- and -propylcelluloses, methyl- and ethyl-hydroxyethylcelluloses, also polytetrahydrofuran, aliphatic and/or aromatic polyisocyanates and also prepolymers of polyols and isocyanates having molar masses of 1000 to 10000 g/mol.

Particular preference for intercalation is given to homo- or copolymers, especially random, block or graft copolymers, water-soluble or water-emulsifiable polymers, for example ethylene-propylene oxide block copolymers or block copolymers based on (poly)hydroxy fatty acids and polyalkylene glycol, especially polyethylene glycol. Preference is given to such polymers having a molecular weight Mn of not less than 1000, especially of 1000 to 10000 g/mol. Further polymers are polyvinyl alcohol, poly(meth)acrylic acids, modified celluloses, such as carboxymethylcelluloses, hydroxyethyl- and -propylcelluloses, methyl- and ethyl-hydroxyethylcelluloses.

Particular preference for use as intercalates is given to melamine or melamine derivatives, especially those of the formula (III)

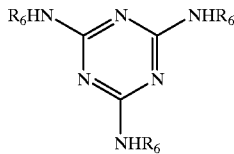

where
  $R_6$ is hydrogen, $C_1$–$C_4$-alkyl, which is optionally substituted by OH groups, or phenyl,
very particularly preferably where
  $R_6$ is hydrogen.

The amount of intercalate incorporable in the crystal lattice of the metal complex is generally 5% to 200% by weight, based on the amount of host compound. Preference is given to an intercalate amount of 10 to 100% by weight. The amount referred to here is the amount of substance which is not washed out by suitable solvents and which is obtained from the elemental analysis. It will be appreciated that it is also possible to add more or less than the aforementioned amount of intercalate, in which case one may optionally not bother to wash an excess out. Preference is given to amounts of 10 to 150% by weight.

The preferred inventive metal complexes of the azo compounds of the formula (I) which host another compound as guest have a color locus which is defined by the following ranges for the chromacity coordinates x and y:

The color loci are determined on alkyd-melamine varnishes according to DIN 53 238 in which the pigments are present in a completely dispersed state.

$x$=0.38 to 0.72, preferably 0.4 to 0.7

$y$=0.14 to 0.55, preferably 0.17 to 0.49 where $$x = \frac{X}{X+Y+Z} \quad y = \frac{Y}{X+Y+Z},$$

where
  X, Y and Z are tristimulus values.

The standardized color system is described in Bayer Farben Revue, Sonderheft 3/2 D, 1986; p. 12–14.

Inclusion compounds, intercalation compounds and solid solutions of metal complexes per se are known from the literature. They and their preparation are described for example in EP-A-0 074 515 and EP-A-0 073 463.

The preparation of these compounds can be effected analogously to that described for example in EP-A0 073 464. The process for preparing the abovementioned metal complexes, takes place in such a way for example that the azo compound of the formula (I), preferably in the form of an alkali metal salt such as Na, Li or K salt, is reacted with a metal salt of metals selected from the group consisting of Li, Cs, Mg, Cd, Co, Al, Cr, Sn and Pb, particularly preferably Na, K, Ca, Sr, Ba, Zn, Fe, Ni, Cu, Mn and La, preferably at pH <7, and the resultant metal complex is reacted with the compound to be included as guest compound, preferably at a pH of 1 to 7. Following the inclusion of the guest compound, the pH is raised to 4.5 or higher, preferably to 4.5 to 7, if the reaction with the guest compound took place at pH of less than 4.5.

The metal salt is preferably selected from water-soluble metal salts of the abovementioned metals, especially chlorides, bromides, acetates, nitrates, etc. Preferred metal salts have a water solubility of more than 20 g/l, especially more than 50 g/l, at 20° C.

Suitable metal salts for preparing the salts and complexes of the azo compounds are for example magnesium chloride, magnesium sulphate, calcium chloride, calcium acetate, calcium formate, barium chloride, barium nitrate, barium acetate, barium carbonate, strontium nitrate, manganese chloride, manganese sulphate, iron(III) chloride, iron(III) nitrate, iron(II) sulphate, cobalt chloride, cobalt nitrate, cobalt sulphate, nickel nitrate, nickel sulphate, nickel chloride, nickel acetate, nickel formate, aluminium sulphate, aluminium nitrate, chromium(III) sulphate, chromium(III) nitrate, zinc chloride, zinc sulphate, zinc acetate, cadmium chloride, cadmium sulphate, cadmium nitrate, copper(II) sulphate, copper(II) chloride, copper(II) acetate and copper (I) formate, lanthanum nitrate and aluminium chloride hydrate.

It is also possible to use mixtures of these salts, which may also contain various ones of the metals mentioned. The use of such salt mixtures is especially advisable to obtain intermediate hues for the colored end products.

The thus obtained metal complexes can then be isolated in the form of aqueous press cakes by filtration of their aqueous suspensions. These press cakes can be dried according to customary drying processes, for example after washing with hot water.

Useful drying processes include for example paddle drying or spray drying of appropriately aqueous slurries.

The pigment can subsequently be afterground.

When the metal complexes for use according to the invention are too harsh in texture, they can be converted into soft-textured pigments, for example by the method described in DE-A-19 847 586.

The aqueous press cake is preferably spray-dried as an aqueous slurry, the slurry preferably containing ammonia and/or an inorganic or organic base.

It is likewise preferable for the metal complexes of the invention, if they have a dispersing harshness of >250, to be heat-treated in the presence of water and optionally organic solvents either at a pH of 1 to 4, preferably 1 to 3, especially 1.5 to 2.5, or at a pH of 9 to 13, preferably 10 to 1, and at a temperature of 80 to 180° C., preferably 90 to 140° C., especially 95 to 110° C.

The metal complexes of an azo compound of the formula (I) which contain at least one guest compound are herein referred to as pigments.

The pigments are preferably used in the form of their pigment preparations containing further additives.

The invention therefore also provides pigment preparations containing
  a) at least pigment from the group of metal complexes of an azo compound of the formula (1) which include another compound
  b) at least one organic compound selected from the group of the terpenes, terpenoids, fatty acid esters and the group of the homo- or copolymers, such as random or block copolymers, having a 20° C. water solubility in pH neutral water of less than 1 g/l, especially 0.1 g/l.

The pigment preparations of the invention are particularly preferably in solid form, preferably in the form of powders or granules.

The organic compound of component (b) is preferably solid or liquid at standard atmosphere and has a boiling point of preferably >100° C., especially >150° C., when liquid and a melting point of preferably <150° C., especially <100° C., when solid.

Preferred polymers possess not only a hydrophilic but also a hydrophobic preferably polymeric moiety. Examples of such polymers are random copolymers based on fatty acids or long-chain ($C_{12}$–$C_{22}$) hydrocarbons and polyalkylene glycols, especially polyethylene glycol. Also block copolymers based on (poly)hydroxy fatty acids and polyalkylene glycol, especially polyethylene glycol, and also graft copolymers based on poly(meth)acrylate and polyalkylene glycol, especially polyethylene glycol.

Preferred compounds from the group of the terpenes, terpenoids, fatty acids and fatty esters are ocimene, myrcene, geraniol, nerol, linalool, citronellol, geranial, citronellal, neral, limonene, menthol, for example (–)menthol, menthone or bicyclic monoterpenes, saturated and unsaturated fatty acids of 6 to 22 carbon atoms, for example oleic acid, linoleic acid and linolenic acid or mixtures thereof.

Useful organic compounds for component (b) also include those mentioned above in connection with the abovementioned inclusion compounds, provided they satisfy the criteria desired for the compound of component (b).

When the guest compound and the compound of component b) are identical, a differentiation is made via the washability of compound b) with a suitable solvent.

Preferred pigment preparations contain:
50–99% by weight of at least one pigment of component (a) from the group of the metal complexes of an azo compound of formula 1 which host at least one other compound as guest and
1–100% by weight preferably 2 to 50% by weight, based on the pigment of component (a), of at least one compound of component (b)

Optionally, the pigment preparation of the invention additionally contains a surfactant (c).

Suitable surfactants (c) are for example anionic, cationic, amphoteric or non-ionic.

Suitable anionic surfactants are in particular condensation products of aromatic sulphonic acids with formaldehyde, such as condensation products of formaldehyde and alkylnaphthalenesulphonic acids or of formaldehyde, naphthalenesulphonic acids and/or benzenesulphonic acids, condensation products of optionally substituted phenol with formaldehyde and sodium bisulphite. Also suitable are surfactants from the group of the sulphosuccinic esters and alkylbenzenesulphonates. Also ionically modified, especially sulphated, carboxylated alkoxylated fatty acid alcohols or salts thereof. Alkoxylated fatty acid alcohols are to be understood as meaning in particular those $C_6$–$C_{22}$ fatty acid alcohols which are provided with 5 to 120, preferably 5 to 60, especially with 5 to 30, ethylene oxide and are saturated or unsaturated. Also suitable in particular are ligninsulphonates, for example those which are obtained by the sulphite or kraft process. Preferably they are products which are partially hydrolysed, oxidized, propoxylated, sulphonated, sulphomethylated or desulphonated and fractionated according to known processes, for example according to the molecular weight or according to the degree of sulphonation. Mixtures of sulphite and kraft ligninsulphonates are likewise very effective. Of particular suitability are ligninsulphonates having an average molecular weight between 1000 and 100000 g/mol, an active ligninsulphonate content of not less than 80% by weight and preferably a low level of polyvalent cations. The degree of sulphonation can vary widely.

Examples of useful non-ionic surfactants are reaction products of alkylene oxides with alkylatable compounds, for example fatty alcohols, fatty amines, fatty acids, phenols, alkylphenols, arylalkylphenols, such as styrene-phenol condensates, carboxamides and resin acids. They are for example ethylene oxide adducts from the class of the reaction products of ethylene oxide with:

a1) saturated and/or unsaturated fatty alcohols of 6 to 22 carbon atoms or b1) alkylphenols having 4 to 12 carbon atoms in the alkyl radical or c1) saturated and/or unsaturated fatty amines of 14 to 20 carbon atoms or d1) saturated and/or unsaturated fatty acids of 14 to 20 carbon atoms or e1) hydrogenated and/or unhydrogenated resin acids.

Suitable ethylene oxide adducts are in particular the alkylatable compounds mentioned under a1) to e1) when combined with 5 to 120, especially 5 to 100, especially 5 to 60, particularly preferably 5 to 30, mol of ethylene oxide.

Suitable surfactants also include the esters of the alkoxylation product of the formula (X) known from DE-A 19 712 486 or from DE-A 19 535 246, which conform to the formula (XI) and also these optionally mixed together with the parent compounds of the formula (X). The alkoxylation product of a styrene-phenol condensate of the formula (X) is as hereinbelow defined:

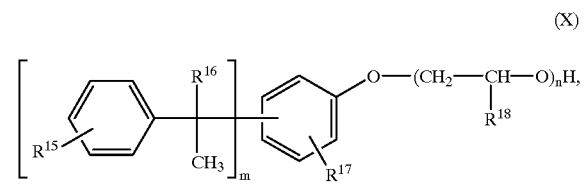

where $R^{15}$ is hydrogen or $C_1$–$C_4$-alkyl, $R^{16}$ is hydrogen or $CH_3$, $R^{17}$ is hydrogen, $C_1$–$C_4$-alkyl, $C_1$–$C_4$-alkoxy, $C_1$–$C_4$-alkoxycarbonyl or phenyl, m is from 1 to 4, n is from 6 to 120, $R^{18}$ is identical or different for each unit with the index n and represents hydrogen, $CH_3$ or phenyl subject to the proviso that, in the case of $CH_3$ being present in the various —(—$CH_2$—$CH(R^{18})$—O—) groups, $R^{18}$ is $CH_3$ in 0 to 60% of the total value of n and is hydrogen in 100 to 40% of the total value of n and in the case of phenyl being present in the various —(—$CH_2$—CH($R^{18}$)—O—) groups, $R^{18}$ is phenyl in 0 to 40% of the total value of n and is hydrogen in 100 to 60% of the total value of n.

Esters of alkoxylation products (X) conform to the formula (XI)

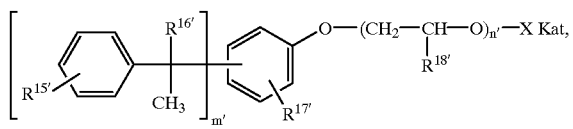

where

R$^{15'}$, R$^{16'}$, R$^{17'}$, R$^{18'}$, m' and n' assume the scope of meaning of R$^{15}$, R$^{16}$, R$^{17}$, R$^{18}$, m and n, respectively, but independently thereof, X is —SO$_3$, —SO$_2$, —PO$_3$ or CO—(R$^{19}$)—COO, Kat is a cation selected from the group consisting of H$^+$, Li$^+$, Na$^+$, K$^+$, NH$^+$ and HO—CH$_2$CH$_2$—NH$_3^+$, subject to the proviso that in the case of X=—PO$_3$— two cations are present, and R$^{19}$ is a divalent aliphatic or aromatic radical, preferably C$_1$–C$_4$-alkylene, especially ethylene, monounsaturated C$_2$–C$_4$ radicals, especially acetylene, or optionally substituted phenylene, especially orthophenylene, preferred substituents being C$_1$–C$_4$-alkyl, C$_1$–C$_4$-alkoxy, C$_1$–C$_4$-alkoxycarbonyl or phenyl.

Specific individual compounds of the formula (XI) are known for example from DE-A 19 712 486 and mixtures of the formulae (X) and (XI) for example from DE-A-19 535 256, which each form part of this application.

A preferred surfactant is the compound of the formula (XI). Preferably a compound of the formula (XI) where X is a radical of the formula —CO(R$^{19}$)—COO— and R$^{19}$ is as defined above.

Preference for use as surfactant is likewise given to a compound of the formula (XI) used together with a compound of the formula (X). In this case, the surfactant preferably contains 5 to 99% by weight of the compound (XI) and 1 to 95% by weight of the compound (X).

The surfactant of component c) is preferably used in an amount of 0.1 to 100% by weight, especially 0.5 to 60% by weight, based on the pigment of component a).

The preparation of the invention may contain further additives, of course. For instance, additives which reduce the viscosity or increase the solids content can be added in an amount of up to 10% by weight during the preparation of aqueous suspensions, based on the preparation.

Examples of further additives are inorganic and organic bases and also additives customary for pigment preparation.

Suitable bases are alkali metal hydroxides, for example NaOH or KOH, organic amines such as alkylamines, especially alkanolamines or alkylalkanolamines.

Particular preference is given to methylamine, dimethylamine, trimethylamine, ethanolamine, n-propanolamine, n-butanolamine, diethanolamine, triethanolamine, methylethanolamine or dimethylethanolamine.

Examples of suitable carboxamides and sulphonamides are urea and substituted ureas such as phenylurea, dodecylurea and others; heterocycles such as barbituric acid, benzimidazolone, benzimidazolone5-sulphonic acid, 2,3-dihydroxyquinoxaline, 2,3-dihydroxyquinoxaline-6-sulphonic acid, carbazole, carbazole-3,6disulphonic acid, 2-hydroxyquinoline, 2,4dihydroxyquinoline, caprolactam, melamine, 6-phenyl-1,3,5-triazine-2,4diamine, 6-methyl-1,3,5-triazine-2,4-diamine, cyanuric acid.

The base is optionally present in up to an amount of 20% by weight, preferably up to 10% by weight, based on the pigment of component a)

The pigment preparations may also contain inorganic and/or organic salts from the production process.

It is particularly preferable for the preparations of the invention to contain more than 90%, especially more than 95%, preferably more than 97%, by weight of pigment of component a), organic compound of component b) and optionally surfactant of component c) and/or base.

A process for preparing the pigment preparations of the invention is characterized in that the pigment of component a), i.e. at least one pigment from the group of the metal complexes from an azo compound of formula I which hosts at least one other compound as guest, a compound of component b) and optionally a surfactant of component c) and optionally further additives are homogenized in water at a pH>6.5, especially >7, and a temperature of 20 to 105° C., preferably 20 to 95° C., especially above the melting temperature of component b), then optionally adjusted to a pH<6,5, especially <5, and the aqueous suspension, optionally after cooling, is filtered and isolated as an aqueous press cake and optionally dried. Homogenization is preferably effected by means of intensive mixers or dissolvers, high speed stirrers, shearing nip mixers or cavitron, ball or bead mill or high pressure homogenizer.

The press cake, for example after washing with hot and/or cold water, may be dried by customary drying processes to give the solid pigment preparation to be used according to the invention.

Useful drying processes include for example tray drying, paddle drying or the spray drying of appropriately adjusted aqueous slurries.

The solid pigment preparation may subsequently be afterground.

The inventive use of the above-described pigments and the inventive pigment preparations for producing color filters for liquid-crystal displays will now be illustrated with reference to the pigment dispersion method involving a photoresist.

The inventive use of the pigments or of the inventive pigment preparations to produce color filters is characterized for example in that the pigment or the pigment preparation, especially the solid pigment preparation, optionally with binder resin and an organic solvent, optionally in the presence of dispersant, is homogenized and subsequently wet-comminuted continuously or batchwise to a particle size by number (electron microscopic determination) of 99.5% <1000 rum, preferably 95% <500 nm especially 90% <200 nm.

Useful wet-comminuting methods include, for example stirrer or dissolver dispersion, grinding by means of stirred ball or bead mills, kneaders, roll mill, high pressure homogenization or ultrasonic dispersion.

During the dispersing treatment or thereafter, one or more photocurable monomers and one or more photoinitiators are added. Following dispersion, further binder resin, solvent or customary photoresist additives may be introduced as is required for the desired photosensitive coating formulation (photoresist) for color filter production. For the purposes of this invention, a photoresist is a preparation containing at least a photocurable monomer and a photoinitiator.

Useful dispersants include generally commercially available for example polymeric, ionic or nonionic dispersants based for example on polycarboxylic acids or polysulphonic acids and also polyethylene oxide-polypropylene oxide block copolymers. It is also possible to use derivatives of organic dyes as dispersants or codispersants.

The production of color filters therefore gives rise to compositions which are likewise according to the invention and contain based on the composition:
- at least one pigment in the above sense or at least one inventive pigment preparation,
- optionally a binder resin,
- at least one organic solvent and also
- optionally a dispersant.

In a preferred embodiment, the composition of the invention contains (percentages based on preparation):
- 1–50% by weight of at least one pigment of component a) or a pigment preparation according to the invention
- 0–20% by weight of binder resin
- 0–20% by weight of dispersant
- 10–94% by weight of organic solvent The coating of the photoresist onto a plate to produce the desired picture element pattern can be effected either by direct or by indirect application. Useful application methods include for example roller coating, spin coating, spray coating, dip coating and air knife coating.

Useful plates include for example according to end use: transparent glasses such as white or blue glass plate, silica-coated blue glass plate, synthetic resin plate or films based for example on polyester, polycarbonate, acrylic or vinyl chloride resin, also metal plates based on aluminium, copper, nickel or steel and also ceramic plates or semiconductor plates having photoelectric transfer elements applied.

Application is generally effective in such a way that the photosensitive layer obtained is 0.1 to 10 μm in thickness.

Application may be followed by thermal drying of the layer.

Irradiation is preferably effected by exposing the photosensitive layer to an active light beam preferably in the form of an image pattern by means of a photomask. This cures the layer in the irradiated areas. Useful light sources include for example high pressure and ultra high pressure mercury vapour lamp, xenon lamp, metal halide lamp, fluorescent lamp and also laser beam in the visible region.

Development following exposure removes the unexposed part of the coating and the desired image pattern form of the color elements is obtained. Customary methods of development comprise spraying with or dipping in aqueous alkaline developer or in an organic solvent containing inorganic alkali such for example sodium hydroxide or potassium hydroxide, sodium metasilicate or organic bases such as monoethanolamine, diethanolamine, triethanolamine, triethylamine or salts thereof.

Development is generally followed by thermal after drying/curing of the image patterns.

Further Pigments

The use of pigments of component a) is preferably characterized in that either individual metal complexes of an azo compound of formula (I) which hosts at least one compound as guest or the inventive solid pigment preparations based thereon are used alone or in mixture with "other pigments" in the color filters or pigment preparations for color filters.

As mentioned above, mixtures of various metal salts may also be useful to prepare the pigments of component a) which are to be used according to the invention or the inventive solid pigment preparations based thereon.

By "other pigments" are meant not only other metal salts of an azo compound of the formula (I) or solid pigment preparations based thereon but also other organic pigments.

With regard to the choice of other pigments optionally to be used, there is no restriction according to the invention. Both inorganic and organic pigments may be used.

Preferred organic pigments are for example those of the monoazo, disazo, laked azo, β-naphthol, Naphthol AS, benzimidazolone, disazocondensation, azo metal complex, isoindoline and isoindolinone series, also polycyclic pigments such as for example from the phthalocyanine, quinacridone, perylene, perinone, thioindigo, anthraquinone, dioxazine, quinophthalone and diketopyrrolopyrrole series. Also laked dyes such as Ca, Mg and Al lakes of sulpho- or carboxyl-containing dyes.

Examples of other organic pigments optionally to be used are yellow pigments of color index
- Colour Index Pigment Yellow 12, 13, 14, 17, 20, 24, 74, 83, 86, 93, 94, 109, 110, 117, 125, 137, 138, 139, 147, 148, 150, 153, 154, 166, 173, 185, or
- Colour Index Pigment Orange 13, 31, 36, 38, 40, 42, 43, 51, 55, 59, 61, 64, 65, 71, 72, 73 or
- Colour Index Pigment Red 9, 97, 122, 123, 144, 149, 166, 168, 177, 180, 192, 215, 216, 224, 254, 272, or
- Colour Index Pigment Green 7, 10, 36, 37, 45, or
- Colour Index Pigment Blue 15, 15:1, 15:2, 15:3, 15:4, 15:6, 16 and
- Colour Index Pigment Violet 19, 23.

When "other pigments" are additionally used, the fraction of metal complex pigments of a compound (I) which host at least one compound as guest or solid pigment preparations based thereon in mixtures with other pigments is preferably 1–99% by weight, especially 5–60% by weight, based on the total amount of all pigments used With regard to binder resins which may be used together with the pigment of component a) or solid pigment preparations based thereon in color filters or in the inventive compositions to produce color filters, for example by the pigment dispersion method, there is no particular restriction according to the invention; in particular, film-forming resins known per se are useful for application in color filters.

Useful are for example binder resins from the group of the cellulose resins such as carboxymethylhydroxyethylcellulose and hydroxyethylcellulose, acrylic resins, alkyd resins, melamine resins, epoxy resins, polyvinyl alcohols, polyvinylpyrrolidones, polyamides, polyamide-imines, polyimides, polyimide precursors such as those of the formula (14) disclosed in JP-A 11 217 514 and esterification products thereof.

Examples thereof are reaction products of tetracarboxylicdianhydride with diamines.

Useful binder resins also include binder resins containing photopolymerizable, unsaturated bonds. Binder resins can be for example binder resins from the group of the acrylic resins. Useful are in particular homo- and copolymers of polymerizable monomers such as, for example, methyl (meth)acrylate, ethyl (meth)acrylate, propyl (meth)acrylate, butyl (meth)acrylate, styrene and styrene derivatives, also copolymers between carboxyl-bearing polymerizable monomers such as (meth)acrylic acid, itaconic acid, maleic acid, maleic anhydride, monoalkyl maleates, especially with alkyl of 1 to 12 carbon atoms, and polymerizable monomers such as (meth)acrylic acid, styrene and styrene derivatives, for example o-methylstyrene, m- or p-methoxystyrene, p-hydroxystyrene. Examples are reaction products of carboxyl-containing polymeric compounds with compounds which each contain an oxirane ring and an ethylenically unsaturated compound, for example glycidyl (meth)acrylate, acryloyl glycidyl ether and monoalkylglycidyl itaconates, etc., also reaction products of carboxyl-containing polymeric compounds with compounds which each contain a hydroxyl group and an ethylenically unsaturated compound (unsaturated alcohols) such as allyl alcohol, 2-buten-4-ol, oleyl alcohol, 2-hydroxyethyl (meth)acrylate, N-methylolacrylamide, etc.; such binder resins may also contain unsaturated compounds that have free isocyanate groups.

Generally the equivalence of the unsaturatedness (molecular weight of binder resin per unsaturated compound) of the binder resins mentioned is in the range from 200 to 3 000, especially from 230 to 1 000, to provide not only adequate photo-polymerizability but also film hardness. The acid value is generally in the range from 20 to 300, especially in the range from 40 to 200, to provide sufficient alkali developability following exposure of the film.

The average molecular weight of the binder resins to be used is between 1500 and 200 000, especially 10000 to 50000, g/mol.

The organic solvents used in the inventive use of the pigment or pigment preparations for color filters are for example ketones, alkylene glycol ethers, alcohols and aromatic compounds. Examples from the group of ketones are acetone, methyl ethyl ketone, cyclohexanone, etc.; from the group of the alkylene glycol ethers; methylcellosolve (ethylene glycol monomethyl ether, butylcellosolve (ethylene glycol monobutyl ether), methylcellosolve acetate, ethylcellosolve acetate, butylcellosolve acetate, ethylene glycol monopropyl ether, ethylene glycol monohexyl ether, ethylene glycol dimethyl ether, diethylene glycol ethyl ether, diethylene glycol diethyl ether, propylene glycol monomethyl ether, propylene glycol monoethyl ether, propylene glycol monopropyl ether, propylene glycol monobutyl ether, propylene glycol monomethyl ether acetate, diethylene glycol methyl ether acetate, diethylene glycol ethyl ether acetate, diethylene glycol propyl ether acetate, diethylene glycol isopropyl ether acetate, diethylene glycol butyl ether acetate, diethylene glycol t-butyl ether acetate, triethylene glycol methyl ether acetate, triethylene glycol ethyl ether acetate, triethylene glycol propyl ether acetate, triethylene glycol isopropyl ether acetate, triethylene glycol butyl ether acetate, triethylene glycol t-butyl ether acetate, etc.; from the group of the alcohols: methyl alcohol, ethyl alcohol, isopropyl alcohol, n-butyl alcohol, 3-methyl-3-methoxybutanol, etc.; from the group of the aromatic solvents: benzene, toluene, xylene, N-methyl-2-pyrrolidone, ethyl N-hydroxymethylpyrrolidone-2 acetate, etc. Further other solvents are 1,2-propanediol diacetate, 3-methyl-3-methoxybutyl acetate, ethyl acetate, tetrahydrofuran, etc. The solvents can be used individually or in mixtures with each other.

The invention further provides a photoresist containing at least one pigment in the above sense or at least one inventive pigment preparation and at least one photocurable monomer and also at least one photoinitiator.

The photocurable monomers contain at least one reactive double bond and optionally other reactive groups in the molecule.

Useful photocurable monomers in this context are in particular reactive solvents or reactive diluents, for example from the group of the mono-, di-, tri- and multifunctional acrylates and methacrylates, vinyl ethers and also glycidyl ethers. Additional reactive groups include allyl, hydroxyl, phosphate, urethane, sec. amine and N-alkoxymethyl groups.

Monomers of this type are known to one skilled in the art and are recited for example in [Römpp Lexikon, Lacke und Drucksfarben, Dr. Ulrich Zorll, Thieme Verlag Stuttgart-New York, 1998, p. 491/492]. The choice of monomers depends in particular on the type and intensity of the irradiation used, the reaction desired with the photoinitiator and the film properties. It is also possible to use combinations of monomers.

Useful photoinitiators are compounds which, as a consequence of the absorption of visible or ultraviolet radiation, form reactive intermediates capable of inducing a polymerization reaction for example of the abovementioned monomers and/or binder resins. Photoinitiators are likewise generally known and can likewise be taken from [Römpp Lexikon, Lacke und Druckfarben, Dr. Ulrich Zorll. Thieme Verlag Stuttgart-New York, 1998, p. 445/446].

According to the invention, there is no restriction with regard to the photocurable monomers or photoinitiators to be used.

The invention preferably provides photoresists containing a) at least one pigment from the class of the metal complexes of an azo compound of the formula I which host at least one fisher compound as guest or inventive solid pigment preparation based thereon, b1) at least one photocurable monomer, b2) at least one photoinitiator, c1) optionally an organic solvent, d) optionally a dispersant, e) optionally a binder resin, and optionally further additives.

According to the invention, there is no restriction either with regard to the technology for generating the colored image element patterns on the basis of the pigments or solid pigment preparations to be used according to the invention. As well as the above-described photolithographic process, other processes such as offset printing, chemical milling or inkjet printing are also suitable. The choice of suitable binder resins and solvents or pigment transfer media and also other additives must be conformed to the particular process. The inkjet process, which includes not only thermal but also mechanical and piezomechanical inkjet printing, utilizes not only purely organic but also aqueous organic vehicle media for the pigments and optionally binder resins; aqueous organic vehicle media are in fact preferred.

EXAMPLES

Preparation Example 1

Preparation of an Inclusion Compound of the Pigment as per the Formula (Ia) where Me=Ni, $R^1=R^{1'}=O$, $R=R'=OH$ which Hosts a Melamine guest: Greenish Yellow Pigment 25 g of benzenesulphonyl hydrazide, 200 ml of water, 20 ml of 10 N hydrochloric acid and 1.25 g of a condensation product of stearic acid with taurine are stirred for 30 minutes. 60 g of ice are added, followed by the dropwise addition over about 30 mins of 34 ml of an aqueous sodium nitrite solution containing 30 g of sodium nitrite in 100 ml of solution. The batch was stirred for 30 minutes during which excess nitrite was maintained. The excess nitrite was then destroyed with a little amidosulphonic acid and the batch was neutralized with about 5 ml of 10 N aqueous sodium hydroxide solution to provide an emulsion of benzenesulphonyl azide.

The thus adjusted emulsion was admixed with 38.2 g of barbituric acid, stirred for 10 minutes and then adjusted to pH 8 with about 33 ml of 10 N aqueous sodium hydroxide solution. The batch was stirred at 50° C. for 2 hours, then adjusted to pH 4.8 with 3 ml of acetic acid and about 14 ml of 10 N hydrochloric acid and subsequently heated at 70° C.

for one hour and at 80° C. for 3 hours to provide a suspension of the sodium salt of azobarbituric acid; about 22 g of the by-produced benzenesulphonamide were additionally present in the solution.

A thus prepared suspension was heated to 95° C. to 100° C., filtered off with suction and washed with about 1 l of boiling hot water a little at a time to provide a press cake of the sodium salt of azobarbituric acid.

The thus prepared press cake was stirred up with 500 ml of water. At 80° C. a solution of 34.5 g of $NiCl_2$–$6H_2O$ and 13 g of anhydrous sodium acetate in 100 ml of water was added dropwise over about 5 minutes. The mixture was stirred at 80° C. for 1 hour, then admixed with 42 g of melamine and stirred once more at 80° C. for 1 hour and at 95° C. for 2 hours, then filtered off hot with suction and washed with hot water.

This provided a water-moist pigment press cake having a solids content of 42.6% by weight.

The color locus determination of the dried and ground pigment in an alkyd-melamine varnish system to DIN 53238 (chromaticity coordinates x, y (color locus) and tristimulus value Y (lightness reference value)) revealed:

x=0.438 y=0.464 Y=58.38

Preparation Example 2

Preparation of an Inclusion Compound of the Pigment as per the Formula (Ia) where Me=Ni, $R^1$=$R^{1'}$=O, R=R'=OH, which Hosts a Melamine Guest: Greenish Yellow Pigment 136 g of aminoguanidine bicarbonate were introduced into 810 g of distilled water and dissolved therein by means of 280 g of hydrochloric acid (30% strength). The solution was then cooled down to about −10° C. with 780 g of ice and subsequently admixed with 232 g of 37% potassium nitrate solution in water until about 15° C. The solution was then subsequently stirred at about 15° C. for 15 minutes and subsequently admixed with 2.0 g of amidosulphuric acid. 269 g of barbituric acid were added, and the batch then heated to 55° C. and subsequently stirred for 2 hours. It was then adjusted to pH 2.5 with aqueous potassium hydroxide solution and subsequently stirred for 30 min. It was then adjusted to pH 4.8 with aqueous potassium hydroxide solution and subsequently stirred for 30 min. The batch was then heated to 80° C. and subsequently stirred at pH 4.8 for 3 hours. This was followed by isolation on a suction filter, washing electrolyte-free, drying at 40° C. in a through-circulation drying cabinet and grinding to provide 334 g of a reddish orange powder.

Calculation for monopotassium salt×$1H_2O$ C 28.4 H 2.1 N 24.8 K 11.6

Found C2.78 H2.4 N24.3 K12.0

Differential scanning calorimetry (DSC) is a specific form of differential thermal analysis. The DSC analyses were measured on a Mettler instrument in a DSC 20 oven. The samples were tested in a crucible having a triply holed lid at a heating rate of 10 K/minute Under the conditions mentioned, the compound prepared by the above method gave an endothermic signal at 135° C. (The stated temperature of 135° C. may fluctuate by ±10° C. owing to the reproducibility limits of the DSC method). From the differential thermal analysis in conjunction with Fourier transform IR analysis it follows that one mole equivalent of water was released at the temperature mentioned.

425 g of water-moist paste of the α-form were prepared according to Example 1 of DE-A 19 945 245, of the azobarbituric acid monopotassium salt *HSO having a solids content of 40%, corresponding to 170 g dry, were homogeneously stirred up in 5000 ml of distilled water using a laboratory stirrer, heated to 95° C. and admixed with 126 g of melamine. 1060 g of aqueous 6.5% strength nickel chloride were then added and subsequently stirred at 95° C. for 1.5 h. This was followed by adjustment to pH 5.5 with aqueous potassium hydroxide solution. This was followed by isolation on an suction filter, washing electrolyte-free, drying at 80° C. in a vacuum drying cabinet and grinding to obtain 288 g of a greenish yellow powder.

The color locus determination of the dried and ground pigment in an alkyd-melamine varnish system to DIN 53238 (chromaticity coordinates x, y (color locus) and tristimulus value Y (lightness reference value)) revealed:

x=0.435 y=0.467 Y=60.71

Preparation Example 3

Preparation of a Solid Pigment Preparation Containing an Inclusion Compound of the Pigment According to Example 1.

8.3 kg of a press cake prepared according to Example 1 were homogeneously suspended in 25 kg of water. 32.5 kg of this suspension were admixed with 19.1 kg of water, heated to about 70° C., adjusted to pH 8.8 with dilute aqueous sodium hydroxide solution and stirred for about 30 minutes.

This was followed by the addition of 9.4 kg of a hot aqueous solution at about 70° C., adjusted to pH 8.8 by means of sodium hydroxide solution and containing 5% by weight of a block copolymer based on (poly)hydroxy fatty acid and polyalkylene glycol and 2.0% by weight of a surfactant based on an ester of an alkoxylation product as per the formula (XI), prepared as described in Example 10 of DE 19 801 759, and stirring at 70° C. for 30 minutes. The pH was then adjusted to about 2 with hydrochloric acid by stirring and maintaining the temperature, and the batch was subsequently stirred for about 60 minutes, adjusted to pH 5.2 with aqueous sodium hydroxide solution and subsequently stirred at about 70° C. for 30 minutes.

The suspension thus obtained was cooled down to 35° C., filtered off with suction and washed with hot water at 30° C. until a conductivity of less than 600 μSi/cm was reached.

This afforded a water-moist pigment press cake having a solids content of 39% by weight. This press cake was oven dried at 70° C. to a residual moisture content of less than 1% by weight and finely blade-milled to the solid pigment preparation to be used according to the invention.

The color locus determination of the dried and ground pigment in an alkyd-melamine varnish system to DIN 53238 (chromaticity coordinates x, y (color locus) and tristimulus value Y (lightness reference value)) revealed:

x=0.442 y=0.465 Y=57.52

Use Example 1

Preparation of a Yellow Composition and use for Producing a Yellow Colour Filter In a Stirred Vessel 774 parts by weight of methoxybutyl acetate (Butoxyl®, Hoechst AG) and 286 parts by weight of a 21% strength solution of an alkali-soluble copolymer binder resin based on benzyl methacrylate (70 parts)/2-hydroxyethyl methacrylate (15 parts)/methacrylic acid (15 parts), molecular weight about 25 000 g/mol, in methoxypropyl acetate were homogeneously mixed and subsequently 100 parts by weight of the inclusion compound of the pigment of Preparation Example 1, which had first been dried at about 70° C. to a residual moisture content of less than 1% by weight, were mixed in homogeneously.

This pigment suspension was ground in a horizontal, sealed bead mill using yttrium-stabilized zirconia beads (0.6 to 10 mm in diameter) in several passes until an effective particle diameter (measured with laser scattering light correlation spectroscopy on an approximately 0.5% by weight reduction in methoxypropyl acetate) of less than 150 nm was obtained with a polydispersity of less than 0.14. (For comparison, a dried film of a 1% reduction in methoxypropyl acetate was observed under the electron microscope to have a very narrow particle size distribution with 95% of the particles below 100 nm).

The composition obtained showed sufficient stability in storage and was very useful for producing a photoresist for color filters by the pigment dispersion method.

Preparation of Photoresist

To 1000 parts by weight of the composition thus obtained were homogeneously added with stirring to 34.5 parts by weight of trimethylolpropane triacrylate (monomeric reactive diluent) and 13.8 parts by weight of a photoinitiator based on benzophenone and N,N'-tetra-ethyl4,4'-diaminobenzophenone in a ratio of 3/1 parts by weight.

This provided a UV-curable photoresist which was applied atop a transparent substrate and developed to form a color filter.

To this end, the photoresist was spuncoated onto a 300× 350 mm piece of cleaned borosilicate glass (Corning® 7059, Owens Corning Corp.) and dried at 110° C. in an oven under clean conditions for 5 minutes to form a film about 1.5 to 2 μm in thickness.

The film, after cooling, was then UV-irradiated at a dosage of 200 mJ/cm$^2$ by means of a negative mask to obtain the desired stripe image pattern and of an ultrahigh pressure mercury vapour lamp and then developed by means of a 0.06% aqueous potassium hydroxide solution at room temperature, cleaned with completely ion-free water and dried. This was followed by a 30 minute postcure at 235° C. in an oven under clean conditions.

The yellow striped color filter thus obtained possessed very good spectral transparency properties and high color purity and brilliance.

The light and beat resistance of the color pigments used is of particular interest for utility as color filters in LCDs.

Heat resistance was tested by producing color filters as above and ageing them in an oven at 250° C. for 1 hour. The total color difference ΔE by means of Cielab measurement compared with a film which had not been thermally treated revealed an ΔE of 0.7.

To test the light fastness, 0.7 g of the above-described ground composition (without monomeric reactive diluent and photoinitiator) was homogeneously dispersed in 10 g of a clear collodion-based test lacquer (Isoderm® Glanz TS, Bayer AG) and drawn down on white paint test cardboard and transparent film (HP Premium® Ink Jet, Hewlett Packard) and dried.

This was followed by 500 hours of irradiation to DIN EN 105B02. The total color difference ΔE by Cielab compared with unirradiated drawdown revealed:

white paint test cardboard: ΔE=18.7 transparent film: ΔE=10.5

Use Example 2

Preparation of a Yellow Composition and use for Producing a Yellow Colour Filter Use Example 1 was repeated using the dried inclusion compound prepared according to Preparation Example 2 to obtain a composition of similar fine subdivision and long term storage stability, which possessed similar properties, especially light and heat resistance, when used in a photoresist for color filters.

The light fastness assessment was carried out as described in Use Example 1.

The total color difference ΔE by Cielab compared with unirradiated drawdown revealed:

white paint test cardboard: ΔB=10.1 transparent film: ΔE=8.3

Use Example 3

Preparation of a Yellow Composition and use for Producing a Yellow Colour Filter:

Use Example 1 was repeated using the solid pigment preparation of Preparation Example 3 (in place of the dried preferred inclusion compound prepared according to Preparation Example 1) to obtain a composition of similar fine subdivision and long term storage stability, which possessed similar properties, especially light and heat resistance, when used in a photoresist for color filters.

Use Example 4

Preparation of a Green Composition and use for Producing a Green Colour Filter:

Use Example 1 was repeated using 40 parts by weight of the inclusion compound of the pigment of Preparation Example 2 and 60 parts by weight of the organic pigment Heliogen® Grün L 9361 (Pigment Green 36, BASF AG)

instead of 100 parts by weight of the dried pigment prepared according to Preparation Example 1 to obtain a very finely divided composition of adequate long term storage stability which was very useful for producing green photoresists for color filters.

A photoresist prepared as described in Use Example 1 and a green striped color filter produced therewith possessed very good spectral transparency properties and also excellent color purity and brilliance and also very good color fastness.

Use Example 5

Preparation of an Inclusion Compound of the Pigment of the Formula (Ia), where Me=Zn, $R^1$= $R^{1'}$=O; R=OH, R'=NHCN, which Hosts a Guest Block Copolymer: Orange Pigment Preparation of the cyaniminoazobarbituric acid starting material: 4.9 mol of diazobarbituric acid (755 g) and 5.0 mol of cyaniminobarbituric acid are suspended in 10 l of $H_2O$ and heated to 80° C. On attainment of 80° C. the batch is adjusted to pH 5 with 30% NaOH and stirred for 3 hour. The red product is filtered, washed with hot water (10 l) and dried to a residual moisture content of less than 1% by weight.

0.3 mol of this product is suspended in 2 l of deionized water and 0.31 mol of ZnCl$_2$ is added. The suspension is stirred at 95° C. and pH 5 for 3 hours. In 500 ml of water, 40 g of an ethylenediamine-based ethylene oxide-propylene oxide block copolymer having a molecular weight of about 6700 (Tetronic® T 904, BASF AG) are suspended and heated to 50° C. This solution is combined with the above suspension and stirred at 95° C. for a further 2 hours. The batch is then filtered off, washed with 2 l of hot water, dried under reduced pressure for 12 hours and dry ground in a laboratory mill. The pigment powder thus obtained is dispersed to DIN 53238 in an alkyl-melamine varnish system.

Colour locus determination revealed:

x=0.561 y=0.365 Y=26.05

The same method as described in Use Example 1 provided a stable very finely divided composition of sufficient long term storage stability which was very useful for producing photoresists for color filters. More particularly, the pigment was suitable for adjusting desired red color filters in combination with other red and/or yellow pigments as prepared for example according to Preparation Examples 1 to 3.

Use Example 6

Preparation of an Inclusion Compound of the Pigment of the Formula (Ia) where Me=Zn, $R^1$=$R^{1'}$=O; R=OH, R'=NHCN which Hosts Guest Melamine: Orange Pigment 0.3 mol of the cyaniminoazobarbituric acid prepared in Use Example 5 are suspended in 2 l of deionized water and admixed with 0.31 mol of ZnCl$_2$. The suspension is stirred at 95° C. and pH 5 for 3 hours.

0.6 mol of melamine is suspended in 500 ml of water and heated to 50°C. This solution is combined with the above suspension and stirred at 95° C. for 2 hours. The batch is then filtered off, washed with 2 l of hot water, dried under reduced pressure for 12 hours and dry ground in a laboratory mill. The pigment powder thus obtained is dispersed to DIN 53238 in an alkyl-melamine varnish system.

Colour locus determination revealed:

x=0.558 y=0.358 Y=21.2

The same method as described in Use Example 1 provided a stable very finely divided composition of sufficient long term storage stability which was very useful for producing photoresists for color filters. More particularly, the pigment was suitable for adjusting desired red color filters in combination with other red and/or yellow pigments as prepared for example according to Preparation Examples 1 to 3.

Use Example 7

Preparation of an Inclusion Compound of the Pigment of the Formula (Ia) where Me=La, $R^1$=$R^{1'}$=O; R=OH, R'=NHCN which Hosts Guest Melamine: Reddish Orange Pigment 0.3 mol of the cyaniminoazobarbituric acid prepared in Use Example 5 are suspended in 2 l of deionized water and admixed with 0.3 mol of La(NO$_3$)$_3$. The suspension is stirred at 95° C. and pH 5 for 3 hours.

0.6 mol of melamine is suspended in 500 ml of water and heated to 50° C. This solution is combined with the above suspension and stirred at 95° C. for 2 hours. The batch is then filtered off, washed with 2 l of hot water, dried under reduced pressure for 12 hours and dry ground in a laboratory mill. The pigment powder thus obtained is dispersed to DIN 53238 in an alkyl-melamine varnish system.

Colour locus determination revealed:

x=0.540 y=0.344 Y=16.6

The same method as described in Use Example 1 provided a stable very finely divided composition of sufficient long term storage stability which was very useful for producing photoresists for color filters. More particularly, the pigment was suitable for adjusting desired red color filters in combination with other red and/or yellow pigments as prepared for example according to Preparation Examples 1 to 3.

Use Example 8

Preparation of an Inclusion Compound of the Pigment of the Formula (Ia) where Me=Ba, $R^1$=O; R=OH, R'=NHCN which Hosts Guest Polyvinyl-Pyrrolidone: Red Pigment 0.3 mol of the cyaniminoazobarbituric acid prepared in Use Example 5 are suspended in 2 l of deionized water and admixed with 0.3 mol of BaCl$_2$. The suspension is stirred at 95° C. and pH 5 for 3 hours.

40 g of polyvinylpyrrolidone (MW 30000 g/mol) is suspended in 500 ml of water and heated to 50° C. This solution is combined with the above suspension and stirred at 95° C. for 2 hours. The batch is then filtered off, washed with 2 l of hot water, dried under reduced pressure for 12 hours and dry ground in a laboratory mill. The pigment powder thus obtained is dispersed to DIN 53238 in an alkyl-melamine varnish system.

Colour locus determination revealed:

x=0.493 y=0.334 Y=11.4

The same method as described in Use Example 1 provided a stable very finely divided composition of sufficient long term storage stability which was very useful for producing photoresists for color filters. More particularly, the pigment was suitable for adjusting desired red color filters in combination with other red and/or yellow pigments as prepared for example according to Preparation Examples 1 to 3.

Use Example 9

Preparation of an Inclusion Compound of the Pigment of the Formula (Ia), where Me=Ca, $R^1$=$R^{1'}$=O; R=OH, R'=NHCN, which Hosts a Guest Block Copolymer: Reddish Orange Pigment 0.3 mol of the cyaniminoazobarbituric acid prepared in Use Example 5 are suspended in 2 l of deionized water and admixed with 0.3 mol of CaCl$_2$. 2H$_2$O. The suspension is stirred at 95° C. and pH 5 for 3 hours.

In 500 ml of water, 40 g of an ethylenediamine-based ethylene oxide-propylene oxide block copolymer having a molecular weight of about 1650 (Tetronic® T 304, BASF AG) are suspended and heated to 50° C. This solution is combined with the above suspension and stirred at 95° C. for a further 2 hours. The batch is then filtered off, washed with 2 l of hot water, dried under reduced pressure for 12 hours and dry ground in a laboratory mill. The pigment powder thus obtained is dispersed to DIN 53238 in an alkyl-melamine varnish system.

Colour locus determination revealed:

x=0.541 y=0.353 Y=27.63

The same method as described in Use Example 1 provided a stable very finely divided composition of sufficient long term storage stability which was very useful for producing photoresists for color filters. More particularly, the pigment was suitable for adjusting desired red color filters in combination with other red and/or yellow pigments as prepared for example according to Preparation Examples 1 to 3.

What is claimed is:

1. A method of pigmenting color filters for liquid-crystal displays comprising pigmenting the color filters with a pigment comprising a metal complex of a mono-, di-, tri-, or tetraanion of an azo compound that in its free acid form conforms to formula (I) or a tautomeric form thereof

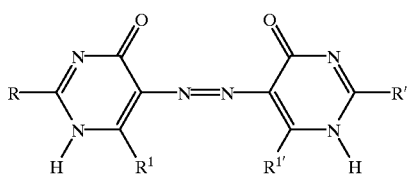

(I)

wherein
R and R' are independently OH, $NH_2$, NH—CN, acylamino, or arylamino, and
$R^1$ and $R^{1'}$ are independently —OH or —$NH_{2'}$, with a metal selected from the group consisting of Na, K, Ca, Sr, Ba, Zn, Fe, Ni, Cu, Mn, La, Li, Cs, Mg, Cd, Co, Al, Cr, Sn, and Pb, wherein the metal complex hosts at least one guest compound.

2. A method according to claim 1 wherein the azo compound in its free acid form conforms to formula (II) or a tautomeric form thereof

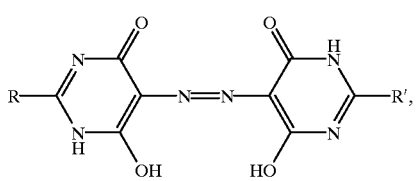

(II)

wherein R and R' are independently OH or NH—CN.

3. A method according to claim 1 wherein the guest compound is a cyclic or acyclic compound.

4. A method according to claim 3 wherein the guest compound is an aliphatic or aromatic hydrocarbon that is optionally substituted with OH, COOH, $NH_2$ or substituted $NH_2$, $CONH_2$ or substituted $CONH_2$, $SO_2NH_2$ or substituted $SO_2NH_2$, $SO_3H$, halogen, $NO_2$, CN, —$SO_2$-alkyl, —$SO_2$-aryl, —O-alkyl, —O-aryl, or —O-acyl.

5. A method according to claim 3 wherein the guest compound is melamine, a melamine derivative, a melamine polycondensate, or a block copolymer based on (poly)stearic acid, (poly)ethylene oxide, and/or (poly)propylene oxide.

6. A method according to claim 1 wherein the metal complex is a 1:1 azo metal complex conforming to formula (Ia) or a tautomeric form thereof

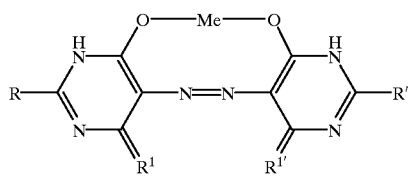

(Ia)

wherein
Me is a metal selected from the group consisting of Na, K, Ca, Sr, Ba, Zn, Fe, Ni, Cu, Mn, La, Li, Cs, Mg, Cd, Co, Al, Cr, Sn, and Pb,
R and R' are independently OH, $NH_2$, NH—CN, acylamino, or arylamino, and
$R^1$ and $R^{1'}$ are independently =O or =NH.

7. A method according to claim 1 wherein the metal complex has a color locus defined by the chromaticity coordinates x of 0.38 to 0.72 and y of 0.14 to 0.55.

8. A method according to claim 1 wherein the pigment is an inclusion compound, an intercalation compound, or a solid solution of an azobarbituric acid-nickel 1:1 complex comprising a 1:1 nickel complex of an azo compound that in its free acid form conforms to formula (IIa) or a tautomeric form thereof

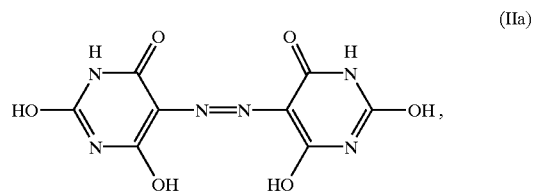

(IIa)

and at least one guest compound of formula (III)

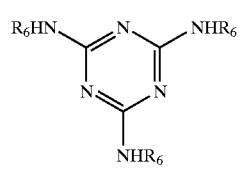

(III)

wherein $R_6$ is hydrogen, $C_1$–$C_4$-alkyl, or $C_1$–$C_4$-alkyl substituted by OH groups.

9. A method according to claim 1 wherein the azo compound is a mono- or dipotassium salt of one or more azo compounds conforming to formula (I) or a tautomeric form thereof

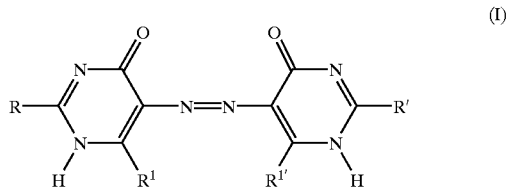

(I)

wherein
R and R' are independently OH, $NH_2$, NH—CN, acylamino, or arylamino, and
$R^1$ and $R^{1'}$ are independently —OH or —$NH_2$,
or a hydrate thereof.

10. A method according to claim 1 wherein the azo compound is a mono- or dipotassium salt of an azo compound conforming to formula (II)

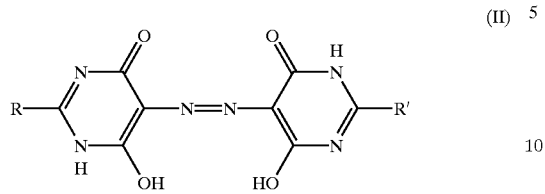

(II)

wherein R and R' are independently OH or NH—CN, or a hydrate thereof.

11. A method according to claim 1 wherein the azo compound is a mono- or dipotassium salt of an azo compound conforming to formula (IIa)

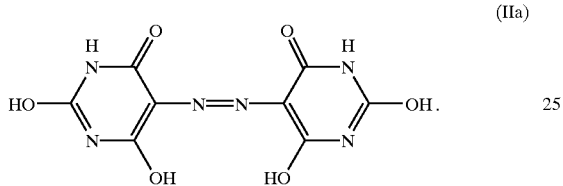

(IIa)

12. A method of pigmenting color filters for liquid-crystal displays comprising pigmenting the color filters with a pigment preparation comprising (a) a pigment comprising at least one metal complex of a mono-, di-, tri-, or tetraanion of an azo compound that in its free acid form conforms to formula (I) or a tautomeric form thereof

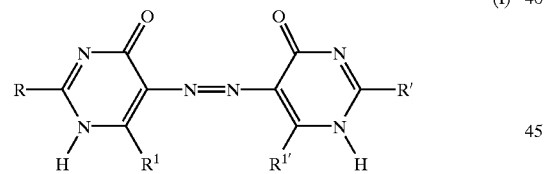

(I)

wherein
R and R' are independently OH, $NH_2$, NH—CN, acylamino, or arylamino, and
$R^1$ and $R^{1'}$ are independently —OH or —$NH_2$,
with a metal selected from the group consisting of Na, K, Ca, Sr, Ba, Zn, Fe, Ni, Cu, Mn, La, Li, Cs, Mg, Cd, Co, Al, Cr, Sn, and Pb,
wherein the metal complex hosts at least one guest compound, and (b) at least one organic compound selected from the group consisting of terpenes, terpenoids, fatty acid esters, homopolymers, and copolymers having a solubility in water at 20° C. of less than 1 g/l.

13. A process for producing color filters for liquid-crystal displays comprising (1) grinding in an organic solvent, optionally in the presence of a binder resin and/or dispersant, at least one metal complex of a mono-, di-, tri-, or tetraanion of an azo compound that in its free acid form conforms to formula (I) or a tautomeric form thereof

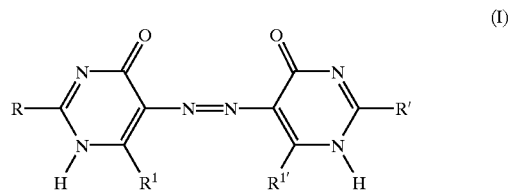

(I)

wherein
R and R' are independently OH, $NH_2$, NH—CN, acylamino, or arylamino, and
$R^1$ and $R^{1'}$ are independently —OH or —$NH_2$,
with a metal selected from the group consisting of Na, K, Ca, Sr, Ba, Zn, Fe, Ni, Cu, Mn, La, Li, Cs, Mg, Cd, Co, Al, Cr, Sn, and Pb,
wherein the metal complex hosts at least one guest compound, (2) processing the ground metal complex in the presence of a photocurable monomer, a photoreaction initiator, and, optionally, further binder and/or solvent to form a photoresist, (3) applying the photoresist to a substrate using a coating method, (4) irradiating the photoresist-coated substrate using a photomask, and (5) curing and developing the irradiated photoresist-coated substrate to form the color filter.

14. A color filter containing at least one metal complex of a mono-, di-, tri-, or tetraanion of an azo compound that in its free acid form conforms to formula (I) or a tautomeric form thereof

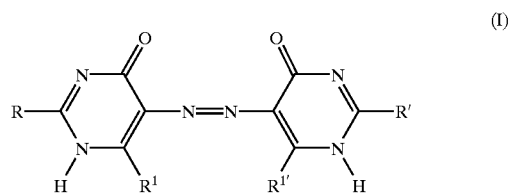

(I)

wherein
R and R' are independently OH, $NH_2$, NH—CN, acylamino, or arylamino, and
$R^1$ and $R^{1'}$ are independently —OH or —$NH_2$, with a metal selected from the group consisting of Na, K, Ca, Sr, Ba, Zn, Fe, Ni, Cu, Mn, La, Li, Cs, Mg, Cd, Co, Al, Cr, Sn, and Pb, wherein the metal complex hosts at least one guest compound.

15. A liquid-crystal display containing at least one color filter according to claim 14.

16. A method comprising producing color filters by photolithography with a printing ink containing a pigment preparation comprising a metal complex of a mono-, di-, tri-, or tetraanion of an azo compound that in its free acid form conforms to formula (I) or a tautomeric form thereof

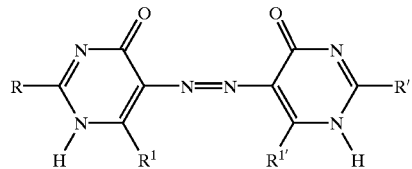
(I)

wherein
R and R' are independently OH, $NH_2$, NH—CN, acylamino, or arylamino, and
$R^1$ and $R^{1'}$ are independently —OH or —$NH_2$,
with a metal selected from the group consisting of Na, K, Ca, Sr, Ba, Zn, Fe, Ni, Cu, Mn, La, Li, Cs, Mg, Cd, Co, Al, Cr, Sn, and Pb,
wherein the metal complex hosts at least one guest compound.

17. A method according to claim 16 wherein the printing ink additionally comprises an aqueous organic vehicle medium.

* * * * *